United States Patent [19]
Alexander et al.

[11] 4,337,395
[45] Jun. 29, 1982

[54] MONOLITHIC IMAGER

[75] Inventors: David H. Alexander, Santa Monica; George H. Hershman; Michael D. Jack, both of Carlsbad; N. John Koda, Vista; Randahl B. Lloyd, San Marcos, all of Calif.

[73] Assignee: Hughes Aircraft Company, Culver City, Calif.

[21] Appl. No.: 98,262

[22] Filed: Nov. 28, 1979

Related U.S. Application Data

[62] Division of Ser. No. 951,221, Oct. 13, 1978, Pat. No. 4,198,646.

[51] Int. Cl.³ .......................... H01J 31/50; G01J 1/00
[52] U.S. Cl. .................................... 250/332; 250/349
[58] Field of Search ............... 250/332, 330, 333, 334, 250/349, 338; 357/31, 32

[56] References Cited

U.S. PATENT DOCUMENTS 3,689,772 9/1972 George et al. ...................... 357/32
3,742,239 6/1973 Gale ................................. 250/349
3,777,160 12/1973 Bernt ................................ 250/338

Primary Examiner—Alfred E. Smith
Assistant Examiner—Carolyn E. Fields
Attorney, Agent, or Firm—Gerald B. Rosenberg; Joseph E. Szabo; William H. MacAllister

[57] ABSTRACT

A monolithic imager utilizing a plurality of detector cells for detecting the presence of radiation and producing a two dimensional mapping thereof. The detector cells are arrayed in a matrix having a square center surrounded by a number of polygonal rings so that a relatively high resolution mapping of detected radiation is achieved at the center of the imager.

2 Claims, 7 Drawing Figures

MONOLITHIC IMAGER

This is a division of application Ser. No. 951,221, filed Oct. 13, 1978, now U.S. Pat. No. 4,198,646.

BACKGROUND OF THE INVENTION

1. Field of the Invention

The present invention relates to imaging systems responsive to near-IR radiation and, in particular, to such imaging systems which utilize solid-state technologies for the generation and associated processing of radiation-generated charge signals.

2. Description of the Prior Art

The near-infrared (IR) portion of the electromagnetic spectrum bridges the visible (approximately 0.4 $\mu$m to 0.75 $\mu$m) and middle infrared (3 $\mu$m to 6 $\mu$m) regions. Although much work has been directed to the development of high resolution - low crosstalk imagers in the latter two segments of the spectrum, the performance and development of similar devices at near-IR is hampered by the relatively deep photon penetration incurred at near-IR. The application of charge transfer technologies, including CCD (charge coupled device) which offer the possibility of multiplexing several detectors of an array onto a single readout line, has been hampered by the necessity of assuring full depletion at near-IR to avoid crosstalk. It has been established that about ten percent of incident 0.9 $\mu$m photons remain unabsorbed at a depth of 35 $\mu$m in silicon. Yet, the depletion region of a present-day commercial CCD fabricated on an extrinsic substrate is typically 2 $\mu$m or 3 $\mu$m deep.

The known deep depletion property of intrinsic silicon has led to the extensive application of PIN detectors, for instance, in conjunction with laser target designators. The PIN detectors typically feature a collection node of a first conductivity type created on an intrinsic substrate of a second conductivity type and a highly doped backside layer of the second conductivity type (e.g., n-type diode diffusion, p-type high resistivity substrate, p+ ohmic contact). Arrays utilizing such PIN diodes are presently read out by circuitry which is wire bonded directly to the individual detectors of the array. The use of numerous leads severely limits the number of detectors per array for a given size thereof. Although the wires utilized for readout are nominally 1 mil in diameter, the ultrasonic bonding process commonly employed causes the detector contact area to expand to about 3 mils in diameter.

SUMMARY AND OBJECTS OF THE INVENTION

It is therefore a primary object of the present invention to provide an imager which incorporates a high resolution array of detectors on a single chip.

Another object of the present invention is to achieve the above object by means of an array including single detector and image area monitoring capabilities.

Still another object of the present invention is to provide a radiation imager which employs a high resolution center to minimize the imager data rate.

These and other objects are achieved by the present invention which provides for an array of detectors formed on a common substrate of intrinsic material. A particular detector, especially adapted for efficient operation at near-IR and which is suitable for use in the present invention, is described in U.S. Pat. No. 4,198,646, issued Apr. 15, 1980 to Alexander et al., and assigned to the assignee of the present invention. This detector is described below in conjunction with the description of the preferred embodiment.

The monolithic imager utilizes the plurality of arrayed detector cells for detecting the presence of radiation and for producing a two dimensional mapping thereof. The detector cells are arrayed in a matrix having its square center surrounded by a number of polygonal rings. The detectors located within the square center of the imager are arranged as a narrowly spaced square array so that a relatively high resolution mapping of detected radiation can be achieved. The remaining detectors are arrayed in the polygonal rings where high resolution mapping of detected radiation is not required.

BRIEF DESCRIPTION OF THE DRAWINGS

Other objects and advantages will become apparent as the following description proceeds, taken in conjunction with the following drawings in which like numerals represent like features throughout.

DESCRIPTION OF THE PREFERRED EMBODIMENT

Figure 1:
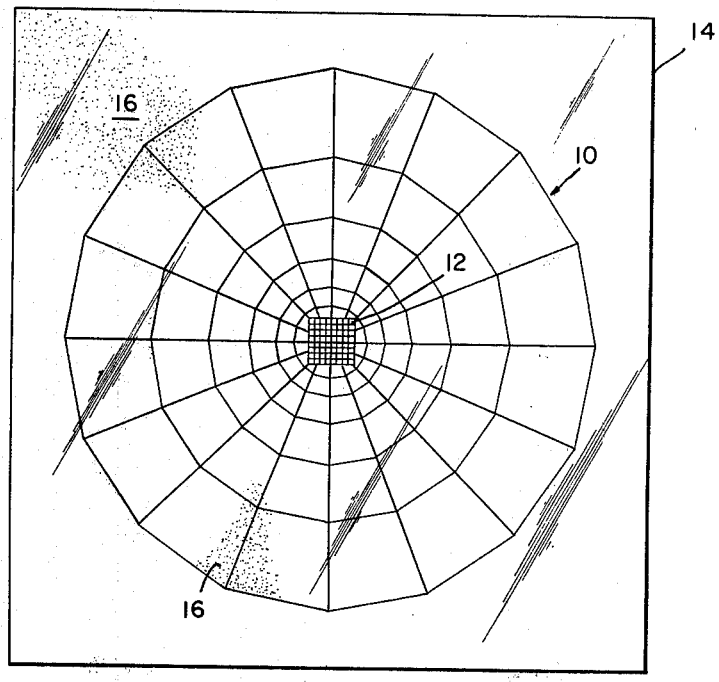
FIG. 1 is a plan view of the backside of the imager of the invention delineating the effective detector charge collection areas of the spider web array.

The backside of the monolithic imager of the present invention is illustrated in FIG. 1. This side acts as the imager's interface with incoming radiation and may include an array comprising a number of detectors, shown in FIG. 1 as an array 10 of one-hundred and sixty (160) such effective detector charge collection regions (each of which is associated with a single detector) in a "spider web" type layout. The spider web array 10 is organized into twenty readout buses (discussed infra) each associated with eight detectors and one output amplifier. A functioning array 10 according to FIG. 1 has been fabricated upon a common substrate 14 measuring 0.200×0.200 inch. The spider web geometry features a high resolution 8×8 detector center section with detectors on 1.65 mil centers. This square array is surrounded by six annular rings which increase in size from the center to the periphery where high resolution is not required. Each output bus is coupled to an output amplifier which is located around the periphery of the chip. The use of twenty output amplifiers allows parallel off-chip signal processing, reducing the data rate of each line by a factor of twenty. While the backside portion of each detector 12 and, hence, of the total array 10 is the illumination "receptor", the reverse side may be characterized its "readout" or "processor" side. The arrangement and operation of the output scheme of the "processor" side will be discussed in detail infra. It may be mentioned at this point that the splitting of functions to opposite sides of the array 10 enables the device to achieve a detection sensitivity unimpeded by (radiation blocking) electrode interconnections. The size and boundary shape of an individual detector 12 of the array 10, of course, varies according to location. This is a foreseeable consequence of the fabrication of a sixteen sided figure from a plurality of four sided geometries. The 8×8 center of the array 10 provides high resolution due to the relatively small, regular size and arrangement of the individual detectors thereof.

Figure 2:
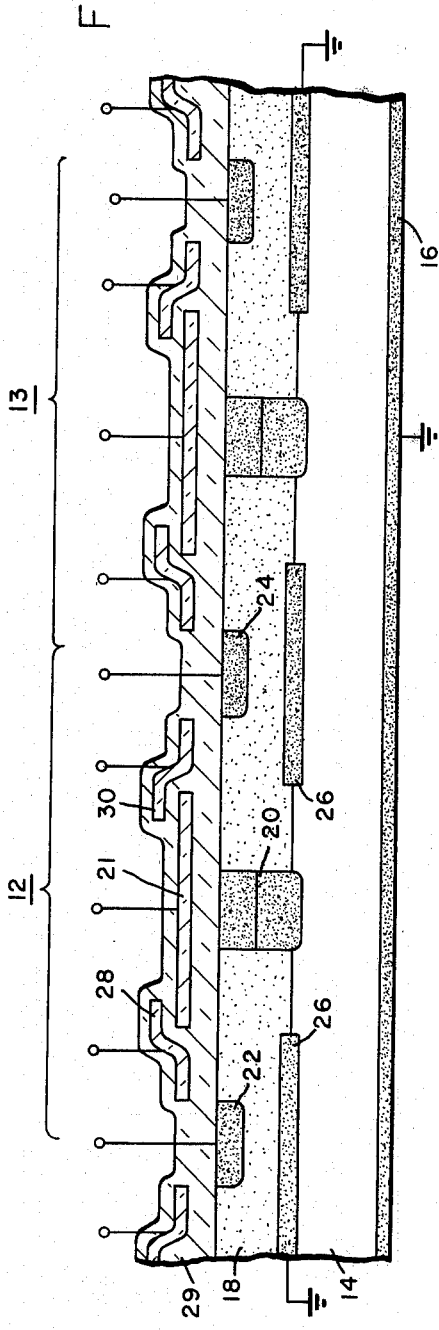
FIG. 2 is an illustration of adjacent detectors (in cross-section) taken from the 8×8 array center of the imager illustrated in FIG. 1; p

The structure of an individual detector 12 will be better understood by reference to FIG. 2. In FIG. 2, there is shown a detailed cross-section of the high resolution center of the array 10 of FIG. 1 including a detector 12. Detector 12 is seen to share, inter alia, the array substrate 14 with the neighboring detector 13. It is a central aspect of the present invention that the substrate 14 is chosen to be of intrinsic (p-type in the illustrated embodiment) material. Typically, such an intrinsic substrate will have a resistivity value in the range of 8,000 to 10,000 ohm-centimeters. This is to be contrasted with a value of 1 to 10 ohm-centimeters for extrinsic silicon. (While "intrinsic" is the applicable term, a more descriptive term might be "intrinsic detector grade silicon" due to the fact that, although no dopants are added, some, like boron, are very hard to remove to obtain a pure or intrinsic material.) It is the utilization of intrinsic (high-resistivity) material for the substrate 14, creating a deeper depletion region for a given "collection" voltage, which enables the present invention to achieve many desirable advantages. The design of low crosstalk detector arrays utilizing small detector size for high resolution is complicated by and made particularly difficult in the near IR (0.8 to 1.0 μm) spectral region. This results from relatively deep (with respect to CCD-level voltages) photon penetration at such wavelengths. Crosstalk is induced in an imager by the generation of carriers outside the depletion layer. The existence of "deep" charge carriers allows the lateral migration of charge uninfluenced by the applied bias. This migration may result in a charge or signal readout for portions of the array 10 which cannot be correlated to the location of the hole-electron generation. The use of "intrinsic" material for the substrate 14, however, allows one to deplete the entire thickness of the substrate 14 of each detector with CCD-range voltages, enabling the imager to achieve enhanced quantum efficiency and resolution in the near IR region of the spectrum and, at the same time, attain the advantages of a CCD readout.

A heavily doped (p-type) region adjacent the substrate 14 forms a window 16 of the detector 12. The window 16 may be formed by a number of materials and processes including, for example, implantation of boron atoms. This window 16 serves to minimize the recombination of photon-generated hole electron pairs. Again, the quantum efficiency of the detector 12 is increased: an increased proportion of radiation-generated carriers will be "read out" as losses by recombination are lessened. (Ordinarily, quantum efficiency is degraded by the tendency of a surface to serve as the location of many recombination sites. A doping gradient resulting from the incorporation of the highly doped window 16 creates an induced electric field which separates the photon-generated hole-electron pairs which might otherwise recombine. That is, the electrons are repelled from the backside toward a floating collection node 20 under the influence of a positively biased storage gate 21.)

A lightly doped (p-type) epitaxial layer 18 is grown above the substrate 14. Although the epitaxial layer 18 is made of extrinsic material, the combination of the extrinsic epitaxial layer 18 and the intrinsic substrate 14, in conjunction with the CCD-compatible voltage of the storage gate 21 allows the depletion of the entire substrate thickness and charge transfer readout thereof. The n-type collection node 20 spans the height of the epitaxial layer 18 and protrudes into the intrinsic substrate 14. The collection node 20 is formed of two diffusions, a buried n+ diffusion and a second n+ diffusion performed after the growth of the epitaxial layer 18. The two n+ diffusions are subsequently merged through the epitaxial layer 18 by a long drive-in step to form the floating node 20, which is influenced by a (positive) voltage applied to the storage gate 21.

Additionally formed within the epitaxial layer 18 are a pair of highly doped (n-type) diffusions. The diffusion 22 serves as the drain diffusion of the detector 12 while the diffusion 24 serves as the output diffusion. The surface of each of these diffusions is coterminous with the top surface of the epitaxial layer 18. The first mentioned diffusion serves as an ohmic contact for the application of the (positive) bias which creates a bucket overload protection potential well, while the second mentioned diffusion provides a contact for the application of the (positive) bias which forms an output well for the readout of charge carriers generated by the incident photons.

Beneath each of the above mentioned epitaxial layer 18 diffusions, there is situated a heavily doped (p-type) slab 26 at the interface of the epitaxial layer 18 and the intrinsic substrate 14. The slab 26 is grounded and acts as a plane to shield the electric fields occasioned by the above-mentioned biases from the charge carriers (electrons in the illustrated embodiment) generated in the substrate 14. Its presence assures that the electron charge carriers migrate only toward the collection node 20 (under the influence of the bias of storage gate 21) rather than the (biased) diffusions 22, 24.

An overflow gate 28 is provided on the readout side of the detector 12 serving as a means for the application of a spillover potential. That is, a potential applied to the gate 28 creates a charge overflow path from the inversion layer formed beneath the storage gate 21 to the potential well beneath the drain diffusion 22. This electrode, like all electrodes (or "gates") disclosed herein may be metallic, polysilicon or the like formed within a layer 29 of insulative material such as silicon dioxide. (The limitation of electron-hole generation to backside illumination minimizes the importance of electrode transparency.) Biases are applied via contact metallizations.

The transfer gate electrode 30 forms a portion of the readout apparatus of the imager. A (positive) voltage applied to the gate 30, when addressed, provides a path to the potential well beneath the output diffusion 24 for the semi-random readout of stored charge. When the gate 30 is not addressed, a potential barrier exists between the collected charge carriers and the readout apparatus.

Figure 3:
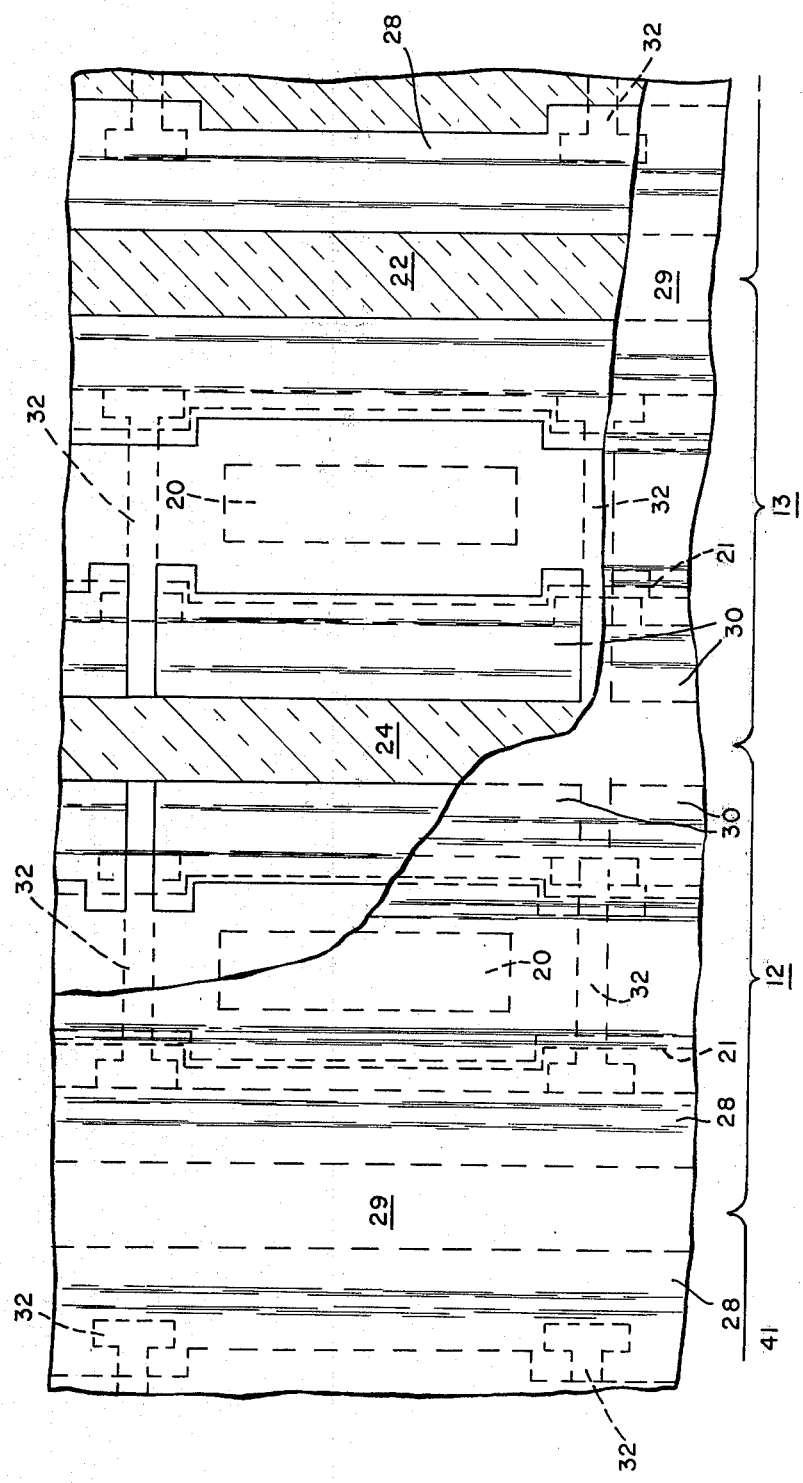
FIG. 3 is a top view showing adjacent detectors of the present invention taken from the 8×8 center of the imager of FIG. 1.

One may complete an understanding of the three dimensional geometry of the detector 12 and of the array 10 by reference to FIG. 3 in which there is shown a partially cut-away view of the top or readout portion of the high resolution center of the array 10. It can be seen that there exists a channel stop 32 at either end of the detector 12. This channel stop 32 is of heavily doped (p-type) material. It is maintained at ground potential to form a "wall" between adjacent detector units 12, further minimizing crosstalk. As actual charge transfer takes place at the surface of the epitaxial layer 18, the channel stop 32 located therein needn't span the entire height of the detector 12. Rather, it is located at the surface thereof, extending slightly into the body of the epitaxial layer 18.

Figure 4A:
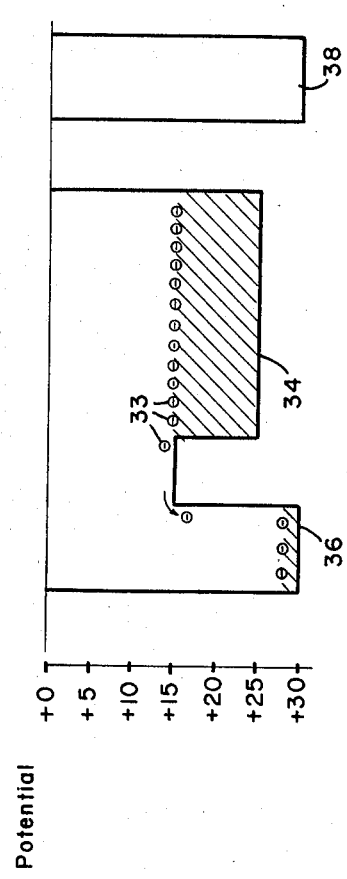
FIGS. 4a and 4b illustrate the charge transfer profile of an individual detector of the present invention.
Figure 4B:
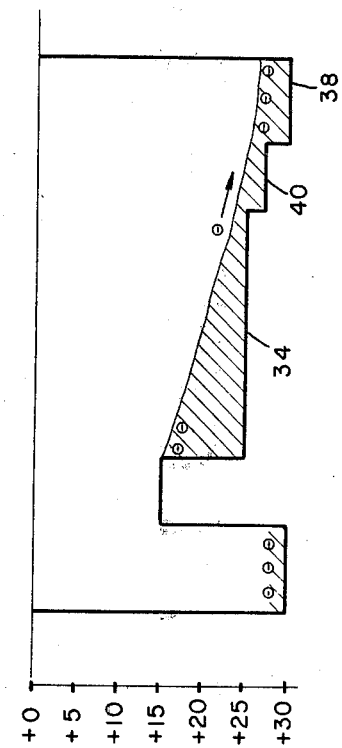

Turning now to FIG. 4, the operation of the charge transfer mechanism of an individual detector will be observed. Before proceeding with this discussion, it should, however, be pointed out that those skilled in the art will readily appreciate that the present invention might have been alternatively implemented to achieve an equivalent device by a reversal of the dopings of the various elements and the various biases applied to the detector 12. Therefore, the detailed charge collection and transfer of FIGS. 4a and 4b is confined to that of a detector 12 fabricated according to the teachings of FIGS. 2 and 3 and does not express the entire scope of the invention herein while illustrating the inventive principles thereof. FIGS. 4a and 4b show the potential profile and resultant charge collection of the detector 12 taken along the overlying "slice" of FIG. 2. Charge carriers 33 (electrons in the case of the illustrated embodiment) are generated in the intrinsic substrate 14 by photon energy illuminating the backside of the imager. The electrons 33 migrate under the influence of the biasing storage gate 21 and collect in an inversion layer at the surface of the epitaxial layer 18. The potential well 34 reflects the positive (+25 volts) bias of the storage gate 21. As the storage gate 21 "bucket" fills with the attracted (oppositely charged) carriers, the potential on the floating n-type collection node 20 diffusion decreases. (For this reason, it is important that a sufficiently large bias be applied to the node 20 by the storage gate 21 to fully deplete substrate 14 under a "full well" condition. If such is not the case, cross-talk will result.) Bucket overload protection is assured by the creation of an overflow well 36 beneath the drain diffusion 22 of the detector 12 by the application of a positive (+30 volts) bias to the diffusion 22 and a lesser positive (+5 volts) bias to the bucket overload gate 28. As illustrated in FIG. 4a "excess" charge (the result of bloom at high illumination levels) adjacent the detector node 20 is dumped into the potential well 36 and removed from the drain diffusion 22 of the detector 12 by an overload bus (not shown). The charge integration time of the detector 12 may be varied, if desired, and some signal charge dumped by clocking the bucket overload gates. During the charge integration period, the detector unit is not addressed by the readout circuitry. Zero (or a negative) bias applied to the transfer gate 30 during this period assures that the flow of collected charge will be directed solely to the overflow potential well 36, eliminating the possibility of undesired charge overflow (and subsequent premature readout) at the readout well 38 beneath the positively-biased output diffusion 24.

The effect of the addressing of the transfer gate 30 of the detector 12 by the readout circuitry is shown in FIG. 4b. The application of a positive potential to the transfer gate 30 induces a transfer well 40 beneath the gate. The transfer well 40 is located intermediate and contiguous to the charge collection potential well 34 and the readout well 38. The magnitude of the addressing voltage applied to the gate 30 is selected between the value of the storage gate 21 potential and the output diffusion 24 potential. The potentials of the contiguous "buckets" being at a variance, the (negatively charged) electrons will seek the potential of the highest positive (least negative) value. This, of course, is the readout well 38. Unlike the situation presented in the potential profile of FIG. 4a, the negatively charged electrons can move in FIG. 4b from the inversion layer beneath the storage gate 21 (potential well 34) to the readout well 38 by a series of moves to regions of successively greater positive potential.

An output amplifier 42, (one of twenty according to the embodiment of FIG. 1) which may be located at the periphery of the array 10, accepts the imaging data of eight detector units sharing a single output bus 44. Transfer gate addressing circuitry initiates readout of charge from the eight associated detector cells. A separately addressed transfer gate 30 is associated with each detector unit of the array. It will be noted from FIG. 3 that the monolithic fabrication of the array 10 allows the pairing of two detectors 12, 13 so that a single output diffusion 24 is shared, while the drain diffusion 22 is shared by the two detectors 12, 41.

Figure 5:
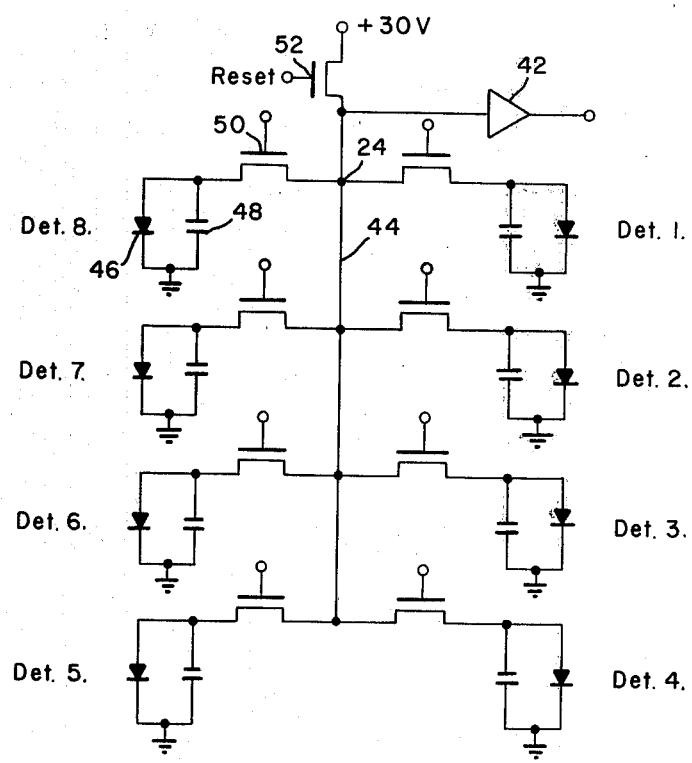
FIG. 5 is a schematic view of the readout structure and circuitry of the present invention.

FIG. 5 is a schematic representation of the readout circuitry and the equivalent circuitry of the image detection mechanisms of the bus 44, one of (the twenty) eight-detector output buses of the array 10. The schematic of an individual detector (ignoring bucket overload protection) includes a parallel diode-capacitor arrangement. The anode of the detector diode 46 corresponds to the collection node 20 of the detector 12 of FIG. 2. The cathode of the diode 46 corresponds to the intrinsic substrate 14 while the capacitance 48 represents the storage of charge in the inversion layer created beneath the storage gate 21. When an addressing voltage is applied to a transfer gate of a detector (the gate of FET 50 represents such a transfer gate), the charge collected in the inversion layer, corresponding to the charge stored on the capacitor 48, is read out by the flow of charge from the detector's output diffusion through the output amplifier 42. The transfer of the collected (negative) charge packet to the floating output diffusion 24 of the detector causes the potential of the diffusion 24 to fall, actuating a response from the output amplifier 42. After the detector transfer gate 30 (gate of FET 50) is turned off and the output of the amplifier 42 settles, the output diffusion is reset to +30 volts by the reset transistor 52. Since eight detectors are multiplexed onto one output bus, eight transfer gate clocks ($\phi 1$–$\phi 8$) are required in addition to a reset clock, $\phi R$. (A sample and hold clock transistor might additionally be employed in the output amplifier 42 to provide a cleaner and longer output signal.)

The readout mechanism for a single output bus 44 may be observed with reference to FIGS. 6a through 6j. The waveforms of FIGS. 6a through 6h represent the eight separate transfer gate addressing clock signals ($\phi 1$–$\phi 8$). The waveform of FIG. 6i is the reset clock $\phi R$ which is applied to FET 52 to restore the potential of the output diffusion 24. FIG. 6j is the resultant signal from the output amplifier 42 associated with the output bus 44. The time sharing of the output amplifier 42 among the eight detectors of its output bus 44 operates as follows: at time $t_0$, "Detector 1" is addressed, (i.e. $\phi 1$ is high turning on the transfer gate) allowing collected charge (electrons) to flow from the inversion layer beneath the storage gate of the detector to the output diffusion 24. The output amplifier 42 then responds to produce the "Detector 1" readout portion of the waveform of FIG. 6j. The presence of signal in "Detector 1"

may be noted by the relatively large perturbation of the output amplifier 42 signal (from +30 volts). At time $t_1$, the transfer clock $\phi_1$ turns off. The output is now valid. At $t_2$, the reset clock turns on and the output diffusion 24 of "Detector 1" is reset to 30v. During this reset, the signal charge which was dumped onto the output diffusion 24 of the detector from its inversion layer is removed through the reset transistor 52. At time $t_3$, the reset clock is turned off and the output diffusion 24 of "Detector 1" is reset and ready to receive the next charge packet generated by backside illumination. At time $t_4$, the transfer clock $\phi_2$ is turned on and the charge integrated on "Detector 2" is transferred to the output diffusion 24. Again, the output amplifier 42 responds and the potential at the output of the amplifier 42 falls, indicating a flow of electrons from the output diffusion 24 of "Detector 2".

Figure 6:
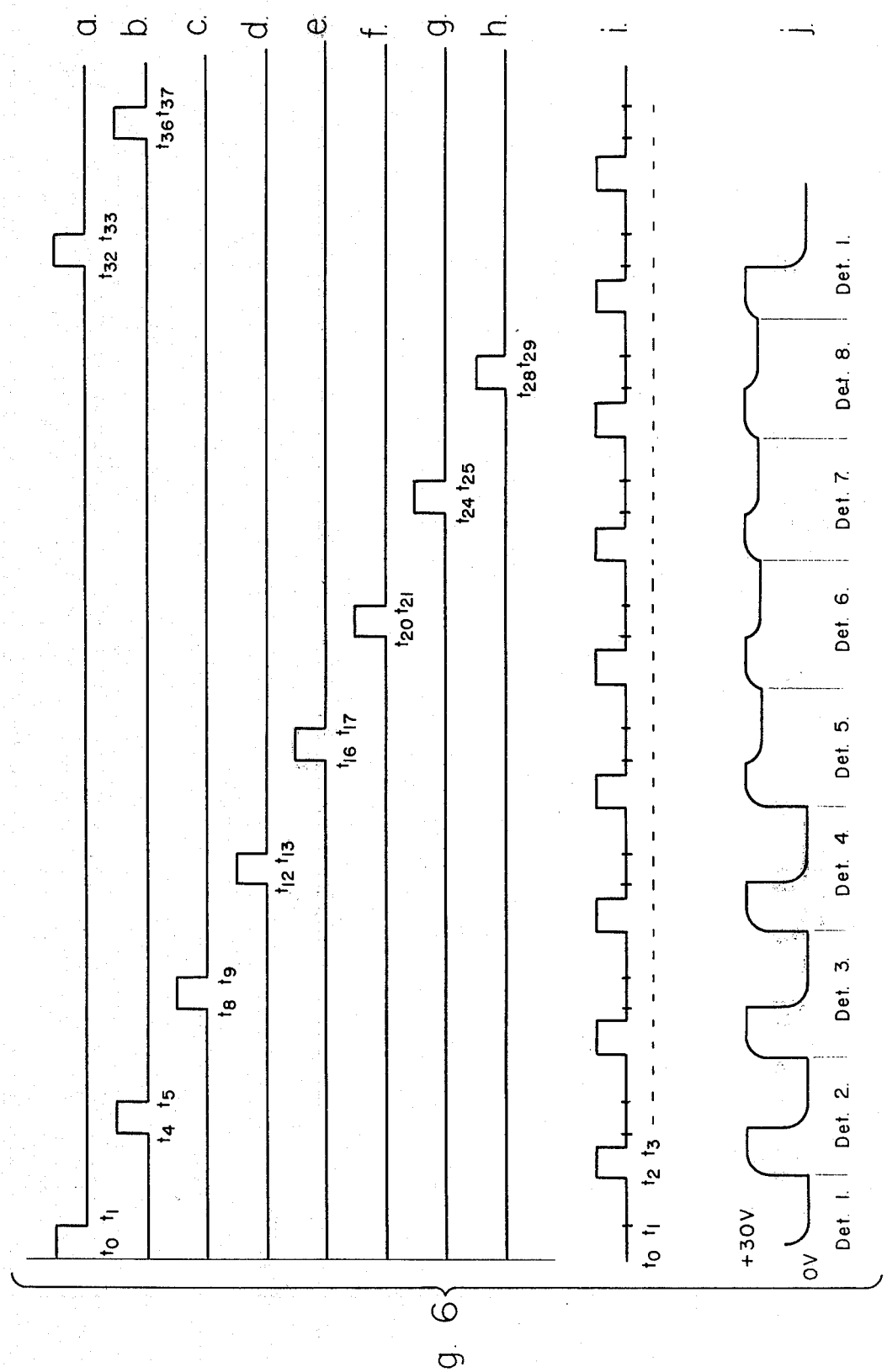
FIGS. 6a through 6j present a set of waveforms illustrating the timing sequence of the readout structure and resultant output of the present invention.

The difference between the (+30 volts) reset level and the signal level at the output of the amplifier 42 is dependent upon the amount of charge collected within the individual detector during its charge integration period. This period, for any given detector, is equal to the interval between the pulse addressing (clocking) of its transfer gate. The output plotted in FIG. 6j illustrates the response to a light spot which illuminates detectors 1, 2, 3 and 4 only. The small response (deviation of signal from reset voltage) shown for detectors 5, 6, 7 and 8 corresponds to the integrated leakage current and is not an indication of readout of photon-generated electrons. The above readout sequence is repeated until all eight detectors have been read out. Thus, one line (of twenty) which generates a two dimensional picture of the near-IR illumination of the imager is created. At time $t_{32}$, "Detector 1" is addressed for a second time, signalling the end of its charge ingtegration period and the beginning of a new readout cycle, for the output bus 44. (In terms of FIG. 6, the integration time for "Detector 1" corresponds to time interval $t_1$ through $t_{32}$, the integration period of "Detector 2" by time $t_5$ through $t_{36}$, etc.). Throughout the description, parasitic effects have been neglected for simplicity. The actual output amplifier 42 waveform is more complicated than that shown in FIG. 6j by virtue, inter alia, of parasitic clock feedthrough.

The above-described readout process may be considered "semi-random". That is, although an integrated readout system using CCD principles is presented (as opposed to individual PIN detector readout requiring a multitude of separate output leads), each detector of the array 10 is individually addressed. Thus, an individual detector can be individually monitored. A twenty-position output selector switch followed by an eight channel (detector) sample and hold demultiplexer would provide a convenient exemplary detector monitoring scheme. Such a scheme might be additionally employed to selectively examine and/or "black out" certain areas of the array 10 as desired by selective programming of the voltages $\phi_1$–$\phi_8$.

Thus, it is seen that there has been added to the imager art a system specifically adapted to accomplish efficient operation at a near-IR. One may attain excellent fidelity of image at near-IR by use of the present invention in which an intrinsic substrate is provided which allows the full depletion of the region of hole-electron generation with CCD-range voltages. Depletion of illumination-generated charge with CCD range voltages leads to the incorporation of a CCD-type imager readout. The aforementioned use of intrinsic material coupled with the employment of a grounded slab to shield the photon-generated signal charges from biases applied to overload and output diffusions enhances the quantum efficiency and minimizes related problems such as crosstalk by assuring the migration of the generated carriers to an inversion layer formed adjacent the detector collection node.

Semi-random readout is provided, in conjunction with CCD-type charge transfer, by the coupling of an array comprising a plurality of detectors to a plurality of output buses and utilizing an associated transfer gate-addressing clocking. The use of charge transfer readout enables one to fabricate a very high resolution chip overcoming the prior art limitation to a small number of PIN detectors per chip. Yet, the semi-random readout scheme employed retains an individual detector-monitoring capability.

What is claimed is:

1. A two dimensional imager for detecting the presence of radiation and producing a mapping thereof comprising:
   (a) a plurality of detectors;
   (b) said plurality of detectors being engaged to image output means; and
   (c) said plurality of detectors being arranged into a matrix having a square center surrounded by a number of polygonal rings so that a relatively high resolution mapping of detected radiation is achieved at the center of said imager.

2. A two dimensional imager as defined in claim 1 further characterized in that:
   (a) said plurality of detectors is monolithically formed on a intrinsic substrate, said substrate having a backside for receiving radiation and an oppositely disposed top surface; and
   (b) a charge collection and transfer apparatus is formed adjacent to the top surface of said intrinsic substrate, enabling said imager to collect and transfer to said image output means substantially all near-IR radiation generated charge carriers, whereby said imager achieves high quantum efficiency at near-IR.

* * * * *